United States Patent
Tang

(10) Patent No.: US 12,107,714 B2
(45) Date of Patent: Oct. 1, 2024

(54) SIGNAL PROCESSING CIRCUIT FOR SUBCARRIER SORTING AND ASSOCIATED SIGNAL PROCESSING METHOD

(71) Applicant: Realtek Semiconductor Corp., HsinChu (TW)

(72) Inventor: Zhiyong Tang, Suzhou (CN)

(73) Assignee: Realtek Semiconductor Corp., HsinChu (TW)

( * ) Notice: Subject to any disclaimer, the term of this patent is extended or adjusted under 35 U.S.C. 154(b) by 68 days.

(21) Appl. No.: 18/129,068

(22) Filed: Mar. 30, 2023

(65) Prior Publication Data

US 2023/0353436 A1    Nov. 2, 2023

(30) Foreign Application Priority Data

Apr. 27, 2022   (CN) .......................... 202210457426.4

(51) Int. Cl.
*H04L 27/26* (2006.01)

(52) U.S. Cl.
CPC ...... *H04L 27/2627* (2013.01); *H04L 27/2649* (2013.01); *H04L 27/2698* (2013.01)

(58) Field of Classification Search
CPC ............. H04L 27/2627; H04L 27/2649; H04L 27/2698
See application file for complete search history.

(56) References Cited

U.S. PATENT DOCUMENTS

| | | | |
|---|---|---|---|
| 2013/0159816 A1* | 6/2013 | Murakami | H04L 27/0008 714/776 |
| 2014/0247803 A1* | 9/2014 | Arambepola | H04L 5/0044 370/330 |
| 2015/0139351 A1* | 5/2015 | Arambepola | H04L 1/0071 375/295 |
| 2018/0324762 A1* | 11/2018 | Zhu | H04L 5/0007 |
| 2021/0036715 A1* | 2/2021 | Jeong | H03M 13/2707 |
| 2021/0111772 A1* | 4/2021 | Lee | H04B 7/0456 |
| 2023/0029215 A1* | 1/2023 | Qu | H04L 5/0051 |
| 2023/0353436 A1* | 11/2023 | Tang | H04L 1/0041 |

* cited by examiner

*Primary Examiner* — Jaison Joseph
(74) *Attorney, Agent, or Firm* — Winston Hsu

(57) ABSTRACT

A signal processing circuit includes an encoding circuit and a subcarrier sorting circuit. The encoding circuit is arranged to encode an input data to generate multiple codewords corresponding to a symbol. The subcarrier sorting circuit is arranged to sequentially arrange multiple subcarriers into an array, wherein a size of the array is M*N, N is a number of columns, N is equal to a number of the multiple codewords corresponding to the symbol, M is a number of rows, and M is a number of the multiple subcarriers divided by N; and the multiple subcarriers are sequentially arranged into the array starting from a row of the array, and subcarriers comprised in each column of the array are arranged to transmit one of the multiple codewords.

18 Claims, 3 Drawing Sheets

| 410_1 | 410_2 | | | | | 410_25 |
|---|---|---|---|---|---|---|
| 1 | 6 | 11 | 16 | ⋯ | 20 | 25 |
| 26 | 31 | 36 | 41 | ⋯ | 45 | 50 |
| 51 | 56 | 61 | 66 | ⋯ | 70 | 75 |
| 76 | 81 | 86 | 91 | ⋯ | 95 | 100 |
| ⋮ | ⋰ | ⋰ | ⋰ | ⋰ | ⋰ | ⋮ |
| 851 | 856 | 861 | 866 | ⋯ | 870 | 875 |
| 876 | 881 | 886 | 891 | ⋯ | 895 | 900 |

FIG. 4

| 510_1 | 510_2 | 510_3 | 510_4 | | | |
|---|---|---|---|---|---|---|
| 1 | 6 | 11 | 16 | ⋯ | 20 | 25 |
| 26 | 31 | 36 | 41 | ⋯ | 45 | 50 |
| 51 | 56 | 61 | 66 | ⋯ | 70 | 75 |
| 76 | 81 | 86 | 91 | ⋯ | 95 | 100 |
| ⋮ | ⋰ | ⋰ | ⋰ | ⋰ | ⋰ | ⋮ |
| 866 | 861 | 856 | 851 | ⋯ | 870 | 875 |
| 876 | 881 | 886 | 891 | ⋯ | 895 | 900 |

SIGNAL PROCESSING CIRCUIT FOR SUBCARRIER SORTING AND ASSOCIATED SIGNAL PROCESSING METHOD

BACKGROUND OF THE INVENTION

1. Field of the Invention

The present invention is related to signal processing, and more particularly, to a signal processing method and a signal processing circuit in the communication system, which can improve the error correction capability of the encoded data by special subcarrier sorting, so that the interleaving mechanism is not required or only an interleaving mechanism with lower depth is required in the communication system.

2. Description of the Prior Art

In a typical communication system (e.g., a digital subscriber line, DSL), a forward error correction (FEC) will be utilized to encode data to generate encoded data for subsequent processing and transmission, wherein the encoded data includes the data and error correction code, and a number of error bits that can be corrected in the encoded data is half of a number of bits in the error correction code. However, in an actual communication system, when the signal is transmitted, it will encounter some sudden interference that may result in continuous errors in the encoded data and make the number of error bits in the encoded data exceed the number of correctable bits. As a result, in order to improve the error correction capability, an interleaving mechanism is provided in the communication system, to distribute the data to different symbols in the time-domain. For example, assuming that the interleaving depth is D, when interference occurs, a number of error bits in each encoded data is (1/D) of an original number of error bits, so that the probability that the number of error bits in the encoded data exceeds the number of correctable bits can be greatly reduced.

However, although the interleaving mechanism can improve the error correction capability of the encoded data, if the interleaving depth is larger, more memory space is required to temporarily store related data. As a result, the more data the memory space temporarily stores, the larger the delay in the communication system is.

SUMMARY OF THE INVENTION

It is therefore one of the objectives of the present invention to provide a signal processing method and a signal processing circuit in the communication system, which can improve the error correction capability of the encoded data by special subcarrier sorting, so that the interleaving mechanism is not required or only an interleaving mechanism with lower depth is required in the communication system, to address the above-mentioned issues.

According to an embodiment of the present invention, a signal processing circuit is provided, wherein the signal processing circuit includes an encoding circuit and a subcarrier sorting circuit. The encoding circuit is arranged to encode an input data to generate multiple codewords corresponding to a symbol. The subcarrier sorting circuit is arranged to sequentially arrange multiple subcarriers into an array, wherein a size of the array is M*N, N is a number of columns, N is equal to a number of the multiple codewords corresponding to the symbol, M is a number of rows, and M is a number of the multiple subcarriers divided by N. The multiple subcarriers are sequentially arranged into the array starting from a row of the array, and subcarriers included in each column of the array are arranged to transmit one of the multiple codewords.

According to an embodiment of the present invention, a signal processing method is provided. The signal processing method includes: encoding an input data to generate multiple codewords corresponding to a symbol; and sequentially arranging the multiple codewords into an array, wherein a size of the array is M*N, N is a number of columns, N is equal to a number of the multiple codewords corresponding to the symbol, M is a number of rows, and M is a number of the multiple subcarriers divided by N; and the multiple subcarriers are sequentially arranged into the array starting from a row of the array, and subcarriers included in each column of the array are arranged to transmit one of the multiple codewords.

One of the benefits of the present invention is that, in the signal processing circuit of the present invention, by sequentially arranging the subcarriers according to the number of codewords included in each symbol, when the subsequent signal is subjected to sudden interference in a certain frequency band, only a small part of subcarriers in each codeword will be affected without exceeding the number of correctable error bits of the codeword, which can enhance the error correction capability of the codeword. In addition, since the error correction capability of the codeword is enhanced, the signal processing circuit has no need to set an interleaving circuit, or only needs to set an interleaving circuit with lower depth, which can improve the problem of signal delay caused by setting the interleaving circuit in the prior art.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram illustrating sorting of subcarriers according to a third embodiment of the present invention.

FIG. 5 is a diagram illustrating sorting of subcarriers according to a fourth embodiment of the present invention.

DETAILED DESCRIPTION

Figure 1:
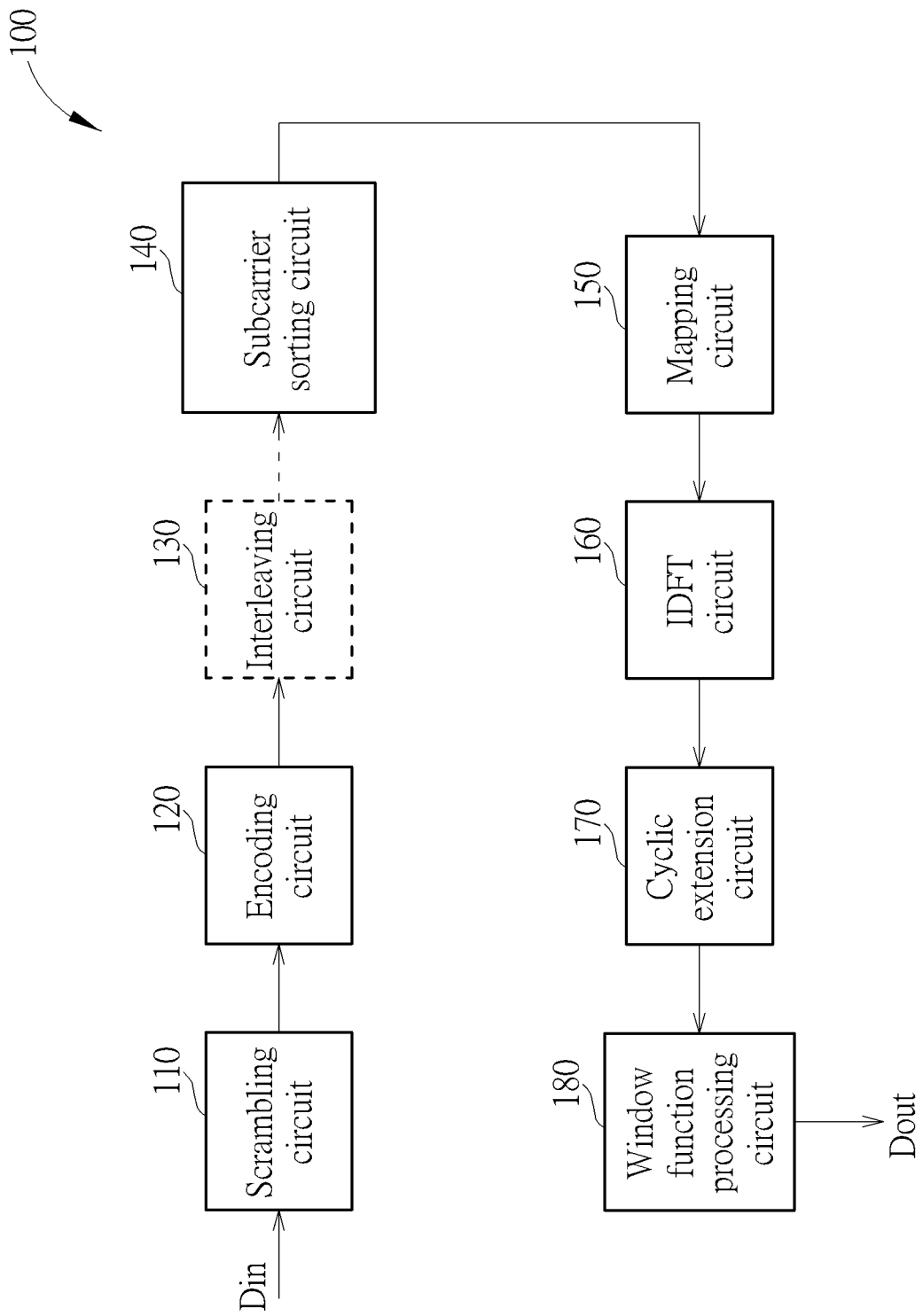
FIG. 1 is a diagram illustrating a signal processing circuit according to an embodiment of the present invention.

FIG. 1 is a diagram illustrating a signal processing circuit 100 according to an embodiment of the present invention. As shown in FIG. 1, the signal processing circuit 100 may include a scrambling circuit 110, an encoding circuit 120, an interleaving circuit 130, a subcarrier sorting circuit 140, a mapping circuit 150, an inverse discrete Fourier transform (IDFT) circuit 160, a cyclic extension circuit 170, and a window function processing circuit 180. In this embodiment, the signal processing circuit 100 can be applicable to a transmitter of an electronic device in a digital subscriber line (DSL) communication system, but the present invention is not limited thereto.

In operations of the signal processing circuit 100, the scrambling circuit 110 performs randomization processing upon an input data Din for avoiding consecutive multiple bits having logical value "1" or "0", to generate a scrambled data. The encoding circuit 120 encodes the scrambled data to generate multiple encoded data. In this embodiment, the encoding circuit 120 is a forward error correction (FEC) encoding circuit, and each of the multiple encoded data includes a set of scrambled data and an FEC codeword of the corresponding error correction code. In the following description, the encoded data is described by the word "codeword". The interleaving circuit 130 distributes multiple codewords generated by the encoding circuit 120 to different symbols in the time-domain. It should be noted that the interleaving circuit 130 is an optional component, that is, the interleaving circuit 130 can be removed from the signal processing circuit 100, which will not affect main operations of the signal processing circuit 100.

Figure 2:
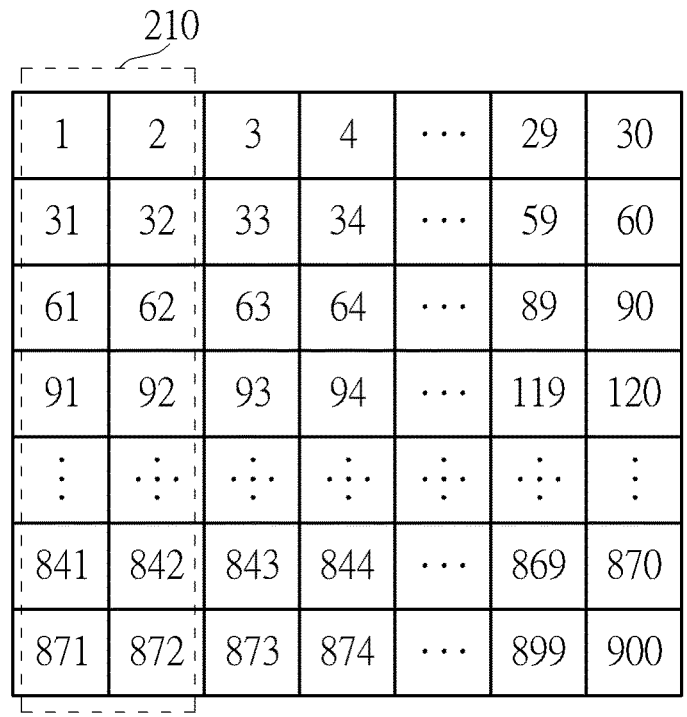
FIG. 2 is a diagram illustrating sorting of subcarriers according to a first embodiment of the present invention.

The subcarrier sorting circuit 140 sequentially arranges subcarriers (or called tones) for subsequent transmission of the codewords that are brought in. Specifically, please refer to FIG. 2. FIG. 2 is a diagram illustrating sorting of subcarriers according to a first embodiment of the present invention. It is assumed that a number of subcarriers is 900 in the following description for better comprehension, but the present invention is not limited thereto. The subcarrier soring circuit 140 can sequentially arrange the subcarriers into an array with a size of D*D, wherein D may be the closest integer value larger than or equal to the square root of the number of subcarriers. In this embodiment, since the number of subcarriers is 900, D is "30". As shown in FIG. 2, the subcarrier sorting circuit 140 can sequentially arrange the subcarriers starting from a row of the array. For example, the subcarrier sorting circuit 140 can sequentially arrange the subcarriers starting from a first row of the array. After the first row is full, the subcarriers can be sequentially arranged by the subcarrier sorting circuit 140 starting from a second row, and so on. That is, the first row includes subcarriers "1"-"30", the second row includes subcarriers "31"-"60", the third row includes subcarriers "61"-"90", and so on, wherein the higher a serial number of a subcarrier is, the higher the frequency of the subcarrier is.

In the array shown in FIG. 2, one or more columns are arranged to transmit a codeword. For example, the subcarriers in the first column and the second column are arranged to transmit a codeword 210, and the subcarriers in the third column and the fourth column are arranged to transmit another codeword. Since the subcarriers utilized by each codeword have large spacing, when the subsequent signal is subjected to sudden interference in a certain frequency band (e.g., interference that occurs on the frequencies corresponding to the subcarriers "31"-"60"), the number of correctable error bits of the codeword will not be exceeded due to each codeword that only includes two of the subcarriers "31"-"60". As a result, the error correction capability of the codeword can be enhanced.

In the embodiment of the FIG. 2, although the error correction capability of the codeword can be enhanced, it does not take into account how many codewords are included in each symbol. In addition, generally speaking, the higher the frequency of a subcarrier is, the worse the anti-interference ability of the subcarrier is. Therefore, a number of bits that is able to be carried by a subcarrier with high frequency is lower than that of a subcarrier with low frequency. The embodiment in FIG. 2 does not take into account the difference in the number of bits that is able to be carried by each subcarrier. As a result, the present invention further provides the following embodiments to further enhance the error correction capability of the codeword.

Figure 3:
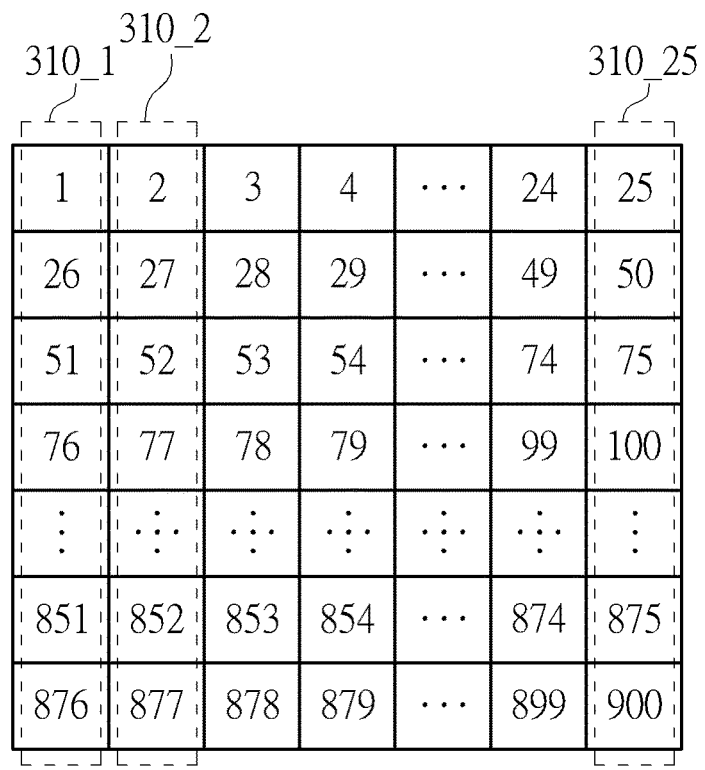
FIG. 3 is a diagram illustrating sorting of subcarriers according to a second embodiment of the present invention.

FIG. 3 is a diagram illustrating sorting of subcarriers according to a second embodiment of the present invention. It is assumed that a number of subcarriers is 900 in the following description for better comprehension, but the present invention is not limited thereto. The subcarrier soring circuit 140 can sequentially arrange the subcarriers into an array with a size of M*N, wherein N is a number of codewords in each symbol, and M is the closest integer value larger than or equal to a value of a number of subcarriers divided by N. In this embodiment, it is assumed that each symbol includes 25 codewords (i.e., N=25), and M is 36 (i.e., 900/25=36). As shown in FIG. 3, the subcarrier sorting circuit 140 can sequentially arrange the subcarriers starting from a first row. After the first row is full, the subcarriers can be sequentially arranged by the subcarrier sorting circuit 140 starting from a second row, and so on. That is, the first row includes subcarriers "1"-"25", the second row includes subcarriers "26"-"50", the third row includes subcarriers "51"-"75", and so on.

In the array shown in FIG. 3, a column is arranged to transmit a codeword. For example, the subcarriers of the first column are arranged to transmit a codeword 310_1, the subcarriers of the second column are arranged to transmit a codeword 310_2, . . . , and the subcarriers of the twenty-fifth column are arranged to transmit a codeword 310_25. Since the subcarriers utilized by each codeword have a large spacing, when the subsequent signal is subjected to sudden interference in a certain frequency band (e.g., interference that occurs on the frequencies corresponding to the subcarriers "26"-"50"), the number of correctable error bits of the codeword will not be exceeded due to each codeword that only includes one of the subcarriers "26"-"50". As a result, the error correction capability of the codeword can be enhanced.

In addition, in order to further make the subcarriers of each column (i.e., each codeword) shown in FIG. 3 have a larger spacing (i.e., a larger frequency difference), please refer to FIG. 4 that is a diagram illustrating sorting of subcarriers according to a third embodiment of the present invention. The subcarrier sorting circuit 140 further performs column exchange (i.e., rearrange or reorder) upon the array shown in FIG. 3, for example, according to the square root of N. In this embodiment, since N is 25 and the square root of N is 5, the subcarrier sorting circuit 140 performs column exchange upon the array shown in FIG. 3 so that difference between serial numbers of the subcarriers in adjacent columns is larger than or equal to 5. For example, it is assumed that serial numbers of the subcarriers of the first row in the array shown in FIG. 3, are 1, 2, 3, 4, 5, 6, 7, 8, 9, 10, 11, 12, . . . , 24, and 25 in sequence. After the column exchange is performed, serial numbers of the subcarriers of the first row are 1, 6, 11, 16, 24, 2, 7, 12, 17, 22, 3, . . . , 20, and 25 in sequence. In addition, in the array shown in FIG. 4, the subcarriers of the first column are arranged to transmit a codeword 410_1, the subcarriers of the second column are arranged to transmit a codeword 410_2, . . . , and the subcarriers of the twenty-fifth column are arranged to transmit a codeword 410_25.

On the other hand, since the number of bits that is able to be carried by each subcarrier may not be the same, the total bits that are able to be carried by multiple subcarriers of each column shown in FIG. 2, FIG. 3, and FIG. 4 may not be the same. As a result, in order to make the total bits that are able to be carried by multiple subcarriers of each column as similar as possible, please refer to FIG. 5 that is a diagram illustrating sorting of subcarriers according to a fourth embodiment of the present invention. The subcarrier sorting circuit 140 may determine whether difference between the total bits that are able to be carried by each column is larger than a threshold value (e.g., 30 bits). If yes, the subcarrier sorting circuit 140 may determine how to exchange the subcarriers according to the number of bits that is able to be carried by each subcarrier of one or more rows. Specifically, since the number of bits that can be carried by the lower row is fewer, the subcarrier sorting circuit 140 can perform column exchange upon the array shown in FIG. 4 starting from the bottom row to the upper row until the difference between the total bits that are able to be carried by each column is not larger than the threshold value. Take FIG. 4 and FIG. 5 as examples for illustration. It is assumed that a row 520 is currently processed, both of the total bits that are able to be carried by each of the first column and the second column in FIG. 4 are larger than that of each of the third column and the fourth column in FIG. 4, and the number of bits that can be carried by the subcarriers "851" and "856" is larger than that of the subcarriers "861" and "866". The subcarrier sorting circuit 140 can perform exchange upon the subcarrier "851" and the subcarrier "866", and perform exchange upon the subcarrier "856" and the subcarrier "861", so that the total bits that are able to be carried by each of the first column to the fourth column are relatively averaged. In addition, in the array shown in FIG. 5, the subcarriers of the first column are arranged to transmit a codeword 510_1, the subcarriers of the second column are arranged to transmit a codeword 510_2, the subcarriers of the third column are arranged to transmit a codeword 510_3, and the subcarriers of the fourth column are arranged to transmit a codeword 510_4.

It should be noted that the exchange performed upon subcarriers upon a certain row in the array shown in FIG. 5 so that the total bits that are able to be carried by each column are relatively averaged can also be applicable to the embodiment shown in FIG. 3.

After the subcarrier sorting circuit 140 sequentially arranges the subcarriers, the mapping circuit 150 may perform a quadrature amplitude modulation (QAM) constellation point mapping operation upon the sorted subcarriers and corresponding codewords, to generate a modulated signal. The IDFT circuit 160 may perform fast Fourier transform upon the modulated signal to generate a time-domain signal. The cyclic extension circuit 170 and the window function processing circuit 180 may process the time-domain signal to generate an output signal Dout, and may transmit the output signal Dout to the back-end analog circuit for subsequent processing and transmission. It should be noted that since the present invention is focused on the subcarrier sorting circuit 140, and the mapping circuit 150, the IDFT circuit 160, the cyclic extension circuit 170, and the window function processing circuit 180 are well known to those with ordinary knowledge in the art, the details will be omitted for brevity.

In summary, in the signal processing circuit of the present invention, by sequentially arranging the subcarriers according to the number of codewords included in each symbol, when the subsequent signal is subjected to sudden interference in a certain frequency band, only a small part of subcarriers in each codeword will be affected without exceeding the number of correctable error bits of the codeword, which can enhance the error correction capability of the codeword. In addition, since the error correction capability of the codeword is enhanced, the signal processing circuit has no need to set an interleaving circuit, or only needs to set an interleaving circuit with lower depth, which can improve the problem of signal delay caused by setting the interleaving circuit in the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing circuit, comprising:
   an encoding circuit, arranged to encode an input data to generate multiple codewords corresponding to a symbol; and
   a subcarrier sorting circuit, arranged to sequentially arrange multiple subcarriers into an array, wherein a size of the array is M*N, N is a number of columns, N is equal to a number of the multiple codewords corresponding to the symbol, M is a number of rows, and M is a number of the multiple subcarriers divided by N; and the multiple subcarriers are sequentially arranged into the array starting from a row of the array, and subcarriers comprised in each column of the array are arranged to transmit one of the multiple codewords.

2. The signal processing circuit of claim 1, wherein the subcarrier sorting circuit sequentially arranges the multiple subcarriers starting from a first row of the array, and then sequentially rearranges a part of columns of the array; and subcarriers comprised in each column of a rearranged array are arranged to transmit one of the multiple codewords.

3. The signal processing circuit of claim 2, wherein the subcarrier sorting circuit sequentially arranges the multiple subcarriers starting from the first row of the array, and then sequentially rearranges the part of the columns of the array, so that difference between numbers of subcarriers in adjacent columns is larger than or equal to a value.

4. The signal processing circuit of claim 3, wherein the value is a square root of N.

5. The signal processing circuit of claim 2, wherein the subcarrier sorting circuit sequentially arranges the multiple subcarriers starting from the first row of the array, and then sequentially rearranges the part of the columns of the array, and determines whether to exchange two subcarriers that belong to different columns according to total bits that are able to be carried by subcarriers of each column in the array.

6. The signal processing circuit of claim 5, wherein when difference between total bits that are able to be carried by subcarriers of two columns in the array conforms to a condition, the subcarrier sorting circuit exchanges two subcarriers that belong to the two columns, respectively.

7. The signal processing circuit of claim 6, wherein the two subcarriers that belong to the two columns, respectively, are located in a same row of the array.

8. The signal processing circuit of claim 1, wherein the subcarrier sorting circuit sequentially arranges the multiple subcarriers starting from a first row of the array, and then determines whether to exchange two subcarriers that belong to different columns according to total bits that are able to be carried by subcarriers of each column in the array.

9. The signal processing circuit of claim 8, wherein when difference between total bits that are able to be carried by subcarriers of two columns in the array conforms to a condition, the subcarrier sorting circuit exchanges two subcarriers that belong to the two columns, respectively, and the two subcarriers that belong to the two columns, respectively, are located in a same row of the array.

10. A signal processing method, comprising:
  encoding an input data to generate multiple codewords corresponding to a symbol; and
  sequentially arranging the multiple codewords into an array, wherein a size of the array is M*N, N is a number of columns, N is equal to a number of the multiple codewords corresponding to the symbol, M is a number of rows, and M is a number of the multiple subcarriers divided by N; and the multiple subcarriers are sequentially arranged into the array starting from a row of the array, and subcarriers comprised in each column of the array are arranged to transmit one of the multiple codewords.

11. The signal processing method of claim 10, wherein sequentially arranging the multiple codewords into the array comprises:
  sequentially arranging the multiple subcarriers starting from a first row of the array, and then sequentially rearranging a part of columns of the array, wherein subcarriers comprised in each column of a rearranged array are arranged to transmit one of the multiple codewords.

12. The signal processing method of claim 11, wherein sequentially arranging the multiple subcarriers into the array comprises:
  sequentially arranging the multiple subcarriers starting from the first t row of the array, and then sequentially rearranging the part of the columns of the array, so that difference between numbers of subcarriers in adjacent columns is larger than or equal to a value.

13. The signal processing method of claim 12, wherein the value is a square root of N.

14. The signal processing method of claim 11, wherein sequentially arranging the multiple subcarriers into the array comprises:
  sequentially arranging the multiple subcarriers starting from the first row of the array, and then sequentially rearranging the part of the columns of the array, and determining whether to exchange two subcarriers that belong to different columns according to total bits that are able to be carried by subcarriers of each column in the array.

15. The signal processing method of claim 14, wherein sequentially arranging the multiple subcarriers into the array comprises:
  in response to difference between total bits that are able to be carried by subcarriers of two columns in the array conforming to a condition, exchanging two subcarriers that belong to the two columns, respectively.

16. The signal processing method of claim 15, wherein the two subcarriers that belong to the two columns, respectively, are located in a same row of the array.

17. The signal processing method of claim 10, wherein sequentially arranging the multiple subcarriers into the array comprises:
  sequentially arranging the multiple subcarriers starting from a first row of the array, and then determining whether to exchange two subcarriers that belong to different columns according to total bits that are able to be carried by subcarriers of each column in the array.

18. The signal processing method of claim 17, wherein sequentially arranging the multiple subcarriers into the array comprises:
  in response to difference between total bits that are able to be carried by subcarriers of two columns in the array conforming to a condition, exchanging two subcarriers that belong to the two columns, respectively, wherein the two subcarriers that belong to the two columns, respectively, are located in a same row of the array.

* * * * *